US008956473B2

(12) United States Patent
Huang et al.

(10) Patent No.: US 8,956,473 B2
(45) Date of Patent: Feb. 17, 2015

(54) METHOD FOR MANUFACTURING NI/IN/SN/CU MULTILAYER STRUCTURE

(71) Applicant: National Taiwan University of Science and Technology, Taipei (TW)

(72) Inventors: Pin-Ju Huang, Taipei (TW); Yee-Wen Yen, Taipei (TW)

(73) Assignee: National Taiwan University of Science and Technology, Taipei (TW)

( * ) Notice: Subject to any disclaimer, the term of this patent is extended or adjusted under 35 U.S.C. 154(b) by 295 days.

(21) Appl. No.: 13/682,707

(22) Filed: Nov. 20, 2012

(65) Prior Publication Data
US 2014/0137989 A1 May 22, 2014

(30) Foreign Application Priority Data

Nov. 20, 2012 (TW) .............................. 101143180 A

(51) Int. Cl.
| C23C 14/34 | (2006.01) |
| C25D 5/02 | (2006.01) |
| B23K 1/00 | (2006.01) |
| B23K 31/02 | (2006.01) |
| C25D 5/50 | (2006.01) |
| C25D 5/10 | (2006.01) |
| C25D 5/12 | (2006.01) |

(52) U.S. Cl.
CPC . *B23K 31/02* (2013.01); *C25D 5/50* (2013.01); *C25D 5/022* (2013.01); *C25D 5/10* (2013.01); *C25D 5/12* (2013.01); *C25D 5/505* (2013.01)
USPC ............................. 148/518; 205/118; 228/175

(58) Field of Classification Search
CPC .......... B23K 31/02; C25D 5/022; C25D 5/10; C25D 5/12; C25D 5/50; C25D 5/505
USPC ........................................................ 148/518
See application file for complete search history.

(56) References Cited

U.S. PATENT DOCUMENTS

| 7,882,627 B2* | 2/2011 | Koyama et al. ................. 29/849 |
| 2005/0202180 A1* | 9/2005 | Cohen et al. .................. 427/402 |
| 2009/0145652 A1* | 6/2009 | En et al. ........................ 174/265 |

OTHER PUBLICATIONS

Pin-Ju Huang "Interfacial Reaction in the Cu/Sn/In/Ni/Cu Multilayer Structure in 3DIC Packaging", Master Thesis (in Chinese with English Abstract) published on Jun. 21, 2012 in National Taiwan University of Science and Technology.

(Continued)

*Primary Examiner* — Roy King
*Assistant Examiner* — Jenny Wu

(57) ABSTRACT

The present invention relates to a method for manufacturing Ni/In/Sn/Cu multilayer structure, in which a Ni/In/Sn/Cu multilayer structure is formed between a first substrate (copper substrate) and a second substrate (such as silicon wafer), and further, a plurality of intermetallic layers are formed in the Ni/In/Sn/Cu multilayer structure through a reflow bonding process and an aging heat treatment, wherein the intermetallic layers comprises a first intermetallic layer of $(Cu,Ni)_6(Sn,In)_5$, a second intermetallic layer of $(Cu,Ni)_6(Sn,In)_5$ and a third intermetallic layer of $(Cu,Ni)_3(Sn,In)_4$. Therefore, the formed intermetallic layers makes the Ni/In/Sn/Cu multilayer structure performs good wettability, ductility, creep resistance, and fatigue resistance. Moreover, this Ni/In/Sn/Cu multilayer structure can be made by low-temperature bonding process, so that Ni/In/Sn/Cu multilayer structure can be an alternative solder for replacing the traditional high-temperature Pb solder and being applied in the package process of 3D IC.

10 Claims, 8 Drawing Sheets

(56) References Cited

OTHER PUBLICATIONS

Chen et al. "Determination of metallic glass regions of Cu-Zr based alloys", a Chinese document published on Nov. 26, 2011 in the conference of the 58th Taiwan Institute of Chemical Engineers (TWICHE) in National Cheng Kung University.

* cited by examiner

_US 8,956,473 B2_

METHOD FOR MANUFACTURING NI/IN/SN/CU MULTILAYER STRUCTURE

BACKGROUND OF THE INVENTION

1. Field of the Invention

The present invention relates to a substrate-bonding process method by using multilayer structure, and more particular, to a method for manufacturing Ni/In/Sn/Cu multilayer structure, in which the Ni/In/Sn/Cu multilayer structure made by the manufacturing method performs good wettability, ductility, creep resistance, and fatigue resistance, so that the Ni/In/Sn/Cu multilayer structure can be an alternative solder for replacing the traditional high-temperature Pb solder and being applied in the package process of 3D IC.

2. Description of the Prior Art

With the evolution of the times, the electronic package technology has been further developed due to the light and thin requirements on electronic products demanded by people. Integrated circuit (IC) is the base of the electronic product, and the IC chip design is developed and tended toward high pin number and multifunction, wherein flip chip technology is an alternative package technology for replacing the traditional bonding technology and used for packaging the high-pin number IC chip. Moreover, for filling large quantities of electronic components into a limited space, the package technology is further developed and tended toward system integrated stage, such as system in package (SiP); for this reason, 3D IC package technology becomes an important issue gradually.

Tin-lead is a conventional solder used in the bonding process of semiconductor devices; however, resulting from the increase of environmental awareness, the production of the electronic products including Pb has been forbidden according to the passed laws in some advanced countries, such as European Union, United States and Japan. Accordingly, in order to replace the tin-lead solder, industries then start to develop others alternative binary alloy solder. Please refer to FIG. 1, there is shown a schematic manufacturing process diagram of a semiconductor package substrate having a pre-solder structure. As shown in FIG. 1, the conventional semiconductor package substrate 2 having the pre-solder structure consists of a package substrate 3, an organic insulating protective layer 33, a conductive film 35, and a solder 38, wherein the a plurality of electrical connection pads 32 are formed on the surface of the package substrate 3. The organic insulating protective layer 33 is also formed on the surface of the package substrate 3, and the electrical connection pads 32 are exposed out of the surface of organic insulating protective layer 33 through thickness thinning process. The conductive film 35 and a resistor layer are sequentially formed on the surface of the package substrate 3, wherein the resistor layer has a plurality of openings. The conductive film 35 and the solder 38 is deposited on the electrical connection pads 32 by electroplating and exposed out via the openings of the resistor layer.

The solder 38 formed on the electrical connection pads 32 by way of electroplating deposition can be lead, tin, silver, copper, bismuth, antimony, zinc, nickel, zirconium, magnesium, indium, tellurium, gallium, or an alloy made of any two or above two elements. In addition, the solder 38 formed on the electrical connection pads 32 can be conductive post form, used for being electrically connected to the electrode pads 52 of the flip-chip semiconductor chip 51. Besides, there has a plurality of metal bumps 53 formed on the electrode pads 52 of the semiconductor chip 51. In the semiconductor chip 51, the electrode pads 52 are made of copper, and the metal bumps 53 can be a solder bumps, gold bumps, copper bumps, or copper posts covered with solder caps.

Inheriting to above descriptions, because the main bonding material used in the manufacturing process of the semiconductor package substrate having pre-solder structure is copper posts covered with solder caps, only Sn/Cu binary alloy would be produced at the bonding interface. Moreover, the poor wettability, poor ductility and high bonding temperature of the Sn/Cu binary alloy easily cause the damage of circuit board.

Thus, in view of the conventional semiconductor package substrate having pre-solder structure and the manufacturing method thereof still have shortcomings and drawbacks, the inventor of the present application has made great efforts to make inventive research thereon and eventually provided a method for manufacturing Ni/In/Sn/Cu multilayer structure; in which the Ni/In/Sn/Cu multilayer structure made by the manufacturing method performs good wettability, ductility, creep resistance, and fatigue resistance, so that the Ni/In/Sn/Cu multilayer structure can be an alternative solder for replacing the traditional high-temperature Pb solder and being applied in the package process of 3D IC.

SUMMARY OF THE INVENTION

The primary objective of the present invention is to provide a method for manufacturing Ni/In/Sn/Cu multilayer structure; in this manufacturing method, a Ni/In/Sn/Cu multilayer structure is formed between a first substrate (copper substrate) and a second substrate (such as silicon wafer); and further, a plurality of intermetallic layers are formed in the Ni/In/Sn/Cu multilayer structure through a reflow bonding process and an aging heat treatment, wherein the intermetallic layers comprises a first intermetallic layer of $(Cu,Ni)_6(Sn,In)_5$, a second intermetallic layer of $(Cu,Ni)_6(Sn,In)_5$ and a third intermetallic layer of $(Cu,Ni)_3(Sn,In)_4$; thus, the formed intermetallic layers makes the Ni/In/Sn/Cu multilayer structure performs good wettability, ductility, creep resistance, and fatigue resistance; moreover, this Ni/In/Sn/Cu multilayer structure can be made by low-temperature bonding process, so that Ni/In/Sn/Cu multilayer structure can be an alternative solder for replacing the traditional high-temperature Pb solder and being applied in the package process of 3D IC.

Accordingly, to achieve the primary objective of the present invention, the inventor of the present invention provides a method for manufacturing Ni/In/Sn/Cu multilayer structure, comprising the steps of:

(1) sequentially electroplating a first nickel layer and an indium layer on a first substrate;

(2) forming a second nickel layer on a second substrate by way of sputtering deposition, and then forming a photoresist layer having a specific pattern on the second nickel layer through photolithography;

(3) sequentially electroplating a copper layer and a tin layer on the second substrate and the photoresist layer;

(4) removing the photoresist layer for forming a plurality copper posts on the second substrate;

(5) stacking the aforesaid first substrate onto the second substrate, so as to make the indium layer on the surface of the first substrate tightly contact with the copper posts on the second substrate;

(6) applying a load to the first substrate or the second substrate, and then executing a reflow bonding process to the first substrate and the second substrate under a specific reflow temperature for a specific reflow time; and (7) baking the product of step (6), and then processing an aging heat treatment to the product under a specific heat-treatment temperature for a specific heat-treatment time, so as to form a multilayer structure having a plurality of intermetallic layers.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a method for manufacturing Ni/In/Sn/Cu multilayer structure according to the present invention, embodiments of the present invention will be described in detail with reference to the attached drawings hereinafter.

Figure 1:
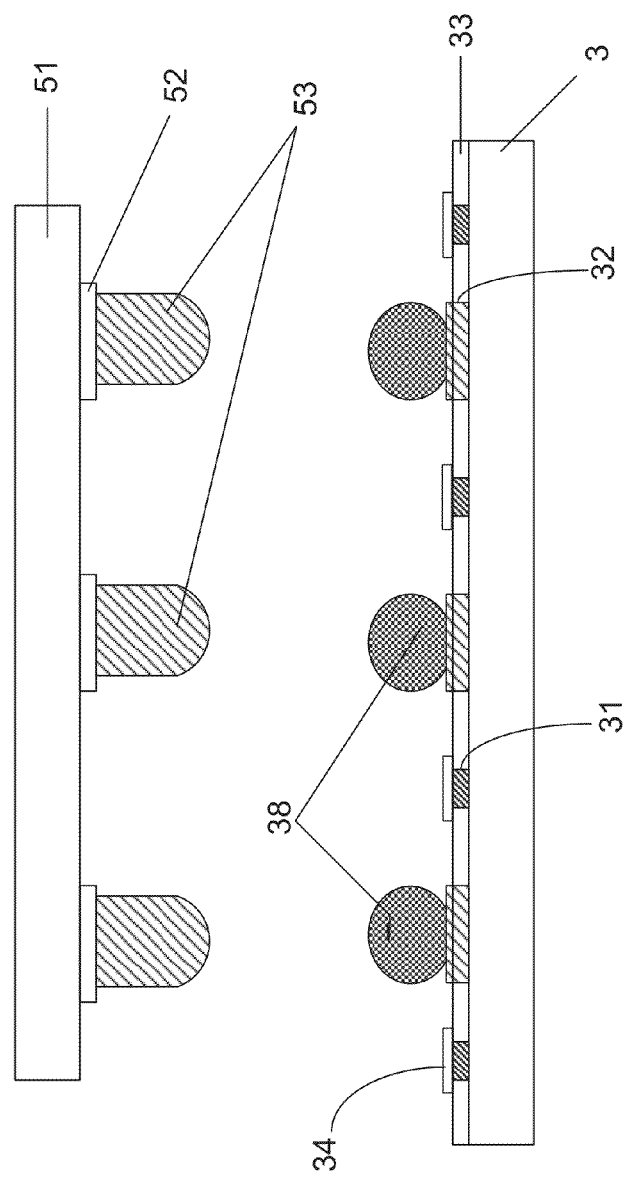
FIG. 1 is a schematic manufacturing process diagram of a semiconductor package substrate having a pre-solder structure.
Figure 2A:
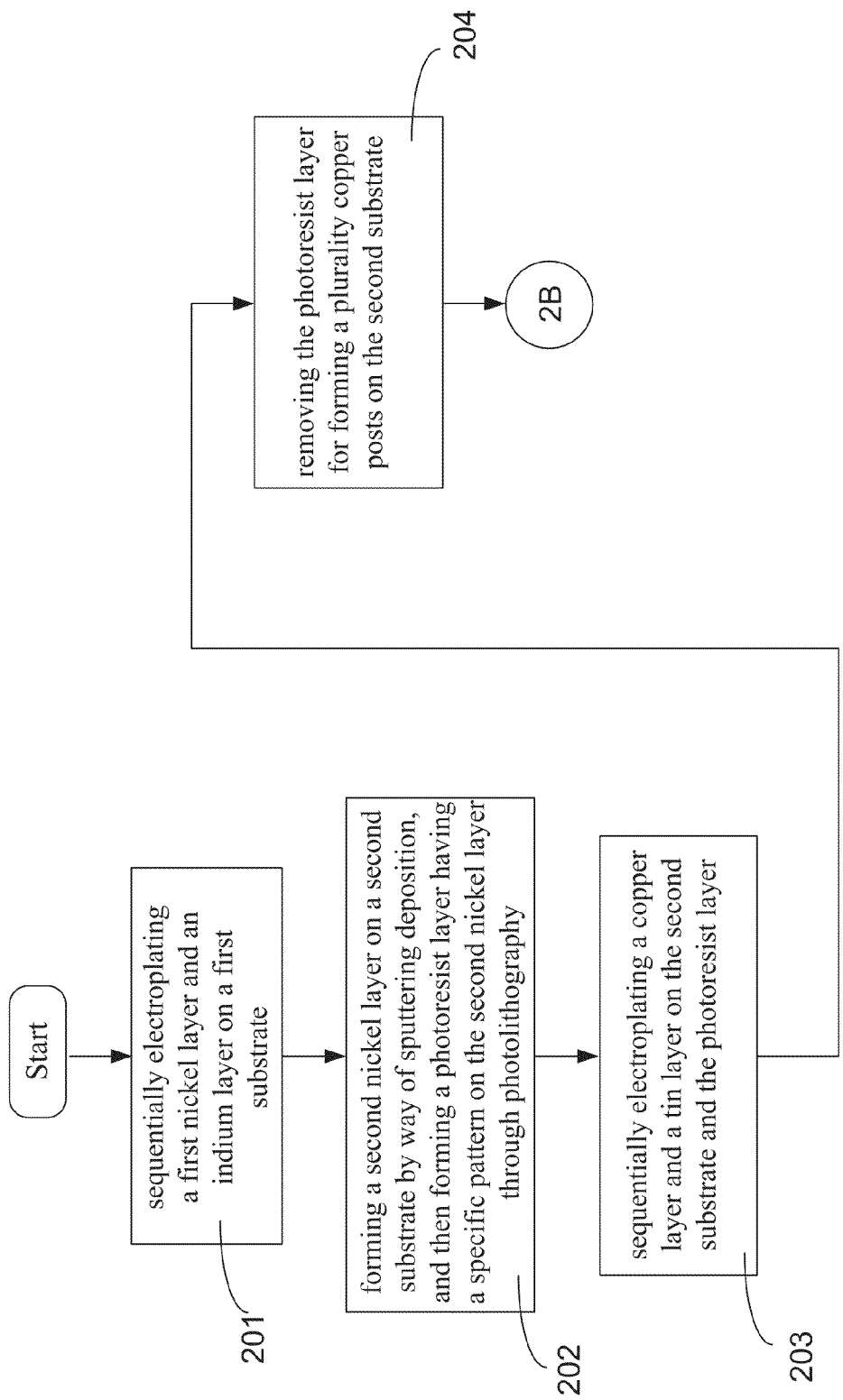
FIG. 2A and FIG. 2B are flowcharts of a method for manufacturing Ni/In/Sn/Cu multilayer structure according to the present invention.
Figure 2B:
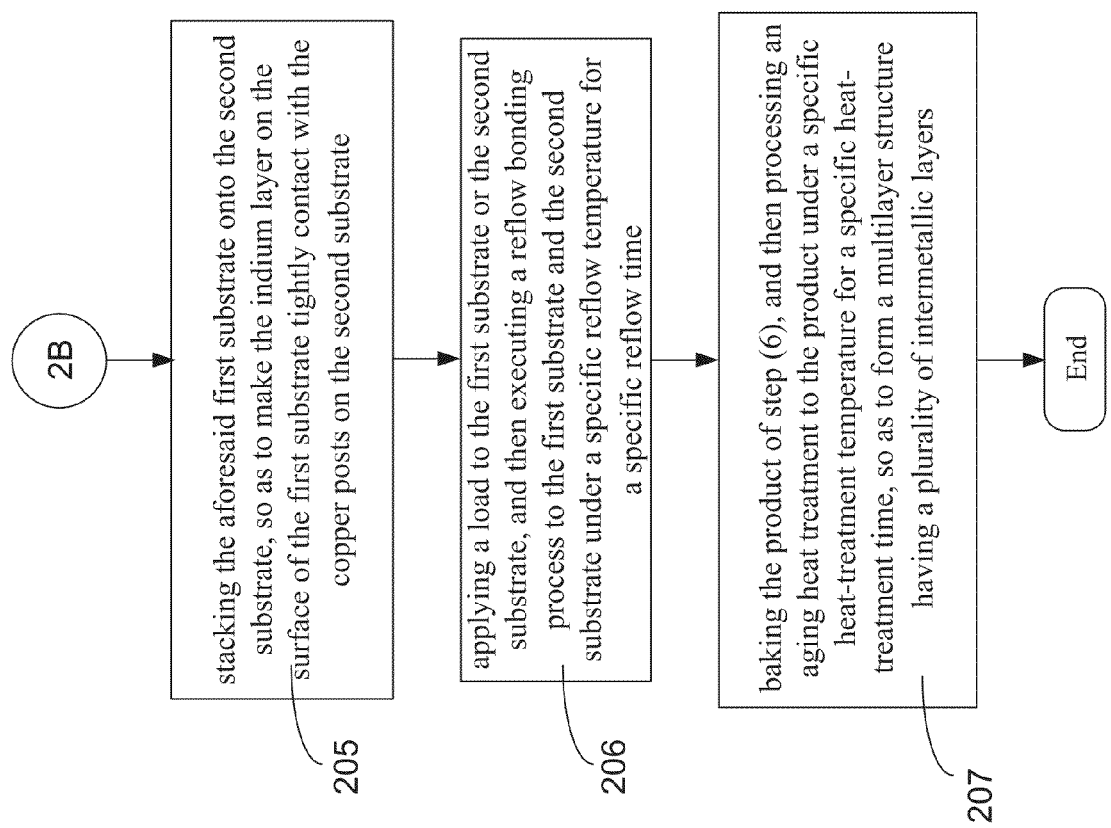
Figure 3A:
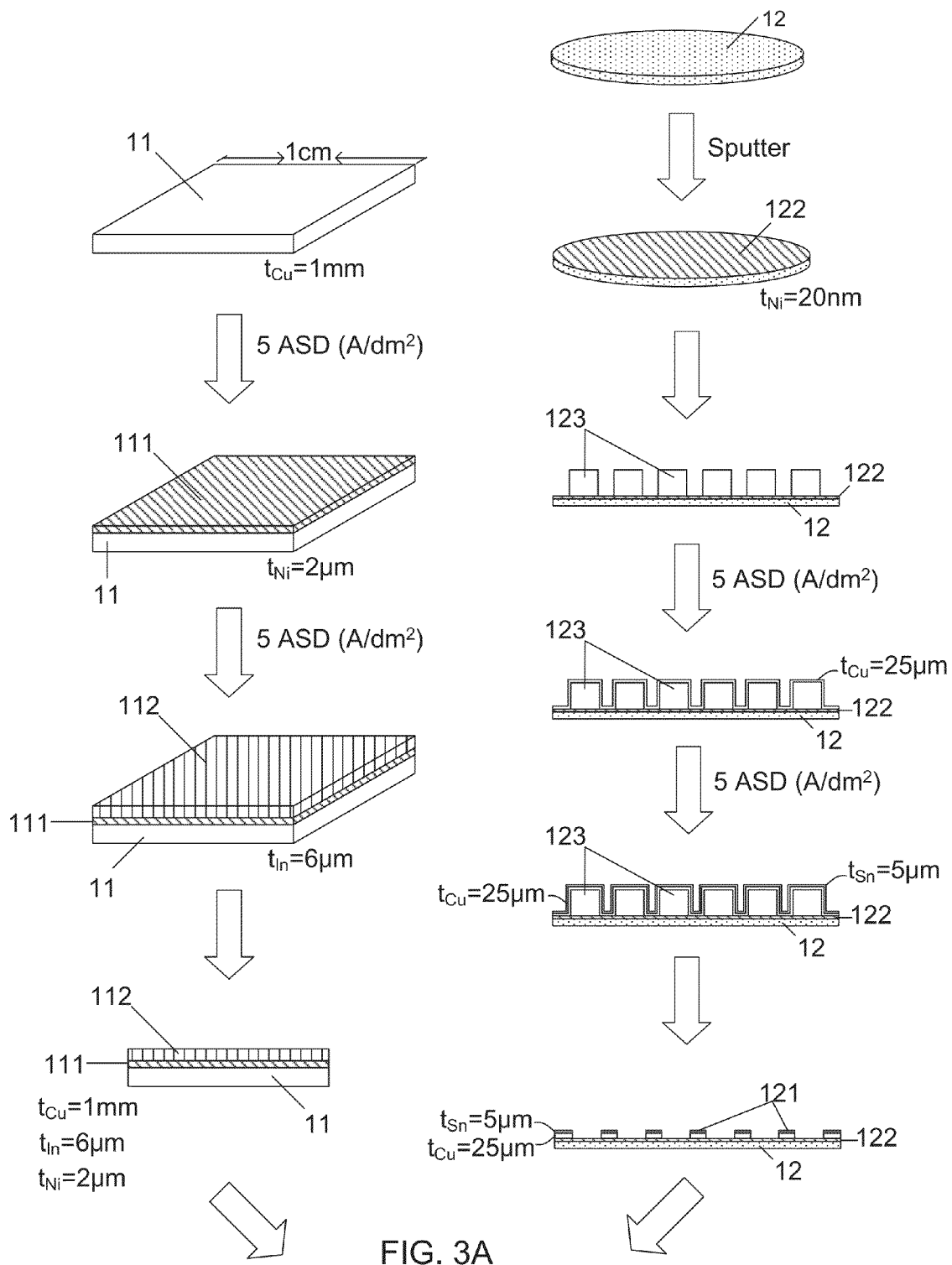
FIG. 3A and FIG. 3B are manufacturing process diagrams of the method for manufacturing Ni/In/Sn/Cu multilayer structure according to the present invention.
Figure 3B:
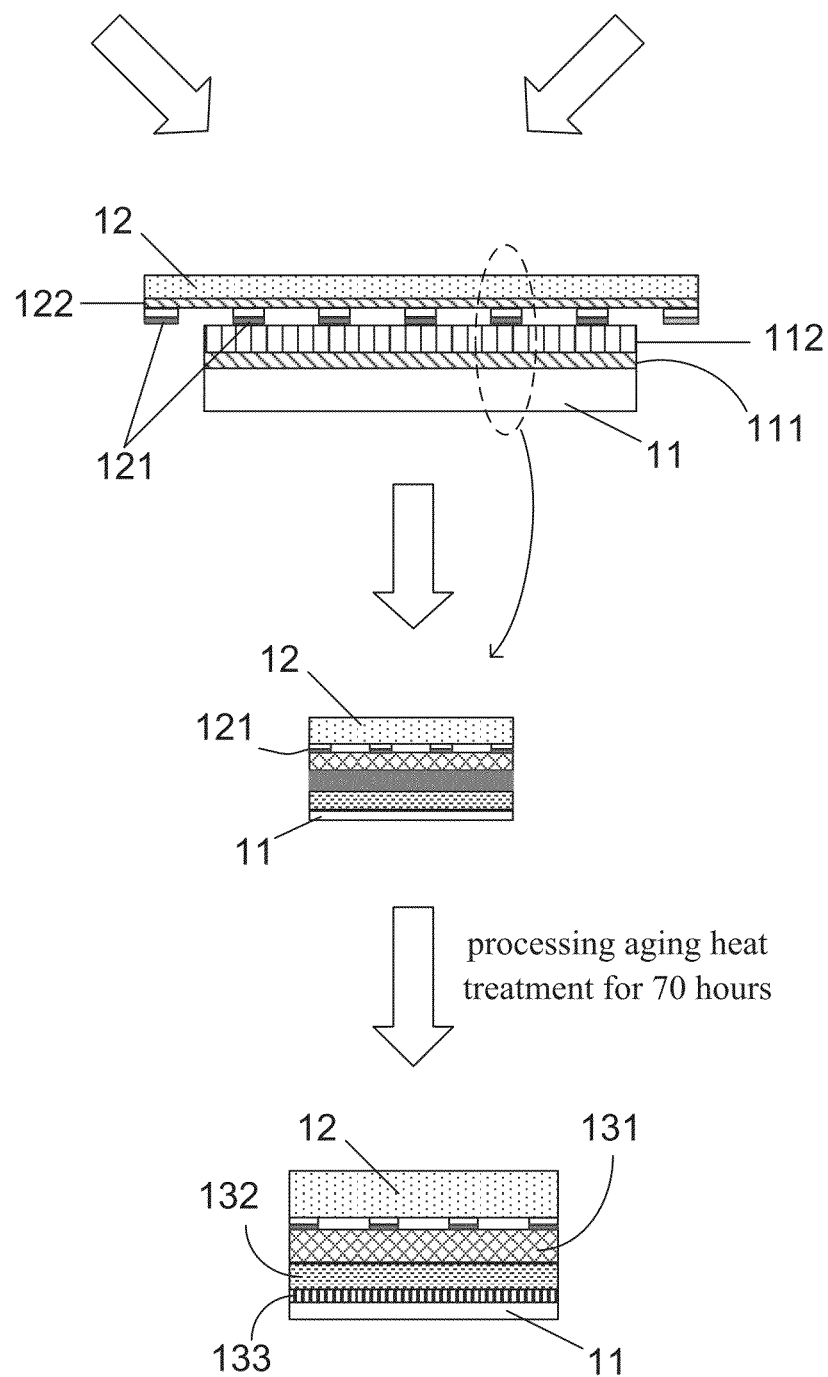

Please refer to FIG. 2A and FIG. 2B, there are shown flowcharts of a method for manufacturing Ni/In/Sn/Cu multilayer structure according to the present invention; besides, please simultaneously refer to FIG. 3A and FIG. 3B, which illustrate manufacturing process diagrams of the method for manufacturing Ni/In/Sn/Cu multilayer structure. As shown in FIG. 2A and FIG. 2B, the Ni/In/Sn/Cu multilayer structure manufacturing method mainly includes 7 steps.

As shown in FIG. 2A and FIG. 3A, step (201) is firstly executed for fabricating a first substrate 11 and sequentially electroplating a first nickel layer 111 and an indium layer 112 on the first substrate 11, wherein the first substrate 11 is a copper substrate on a silicon wafer, a circuit chip or a printed circuit board (PCB). Next, the method is proceeded to step (202) for forming a second nickel layer 122 on a second substrate 12 by way of sputtering deposition, and then forming a photoresist layer 123 having a specific pattern on the second nickel layer 122 through photolithography. In the step (202), the second substrate 12 is a silicon wafer, a circuit chip or a PCB opposite to the aforesaid first substrate 11.

After completing the step (202), step (203) of the method is continuously proceeded for sequentially electroplating a copper layer and a tin layer on the second substrate 12 and the photoresist layer 123, and then the photoresist layer 123 is removed by using alcohol in step (204), so as to form a plurality copper posts 121 on the second substrate 12 as shown in FIG. 3A; in which, each of the plurality copper posts 121 are covered by the tin layer. Herein, it needs to note that the photoresist layer 123 with the specific pattern can be formed on the substrate 12 by way of photolithography due to its positive photoresist characteristics; and then, after the copper layer and the tin layer are electroplated on the substrate 12 and the photoresist layer 123 at the same time, the unnecessary copper layer and the tin layer can be further removed by using the alcohol to eliminate the photoresist layer 123; and this way is so-called lift off.

Continuously, as shown in FIG. 2B and FIG. 3B, the method proceeds to step (205) for stacking the first substrate 11 made by the step (201) onto the second substrate 12 obtained from the step (204), so as to make the indium layer 112 on the surface of the first substrate 11 tightly contact with the copper posts 121 on the second substrate 12.

Figure 4:
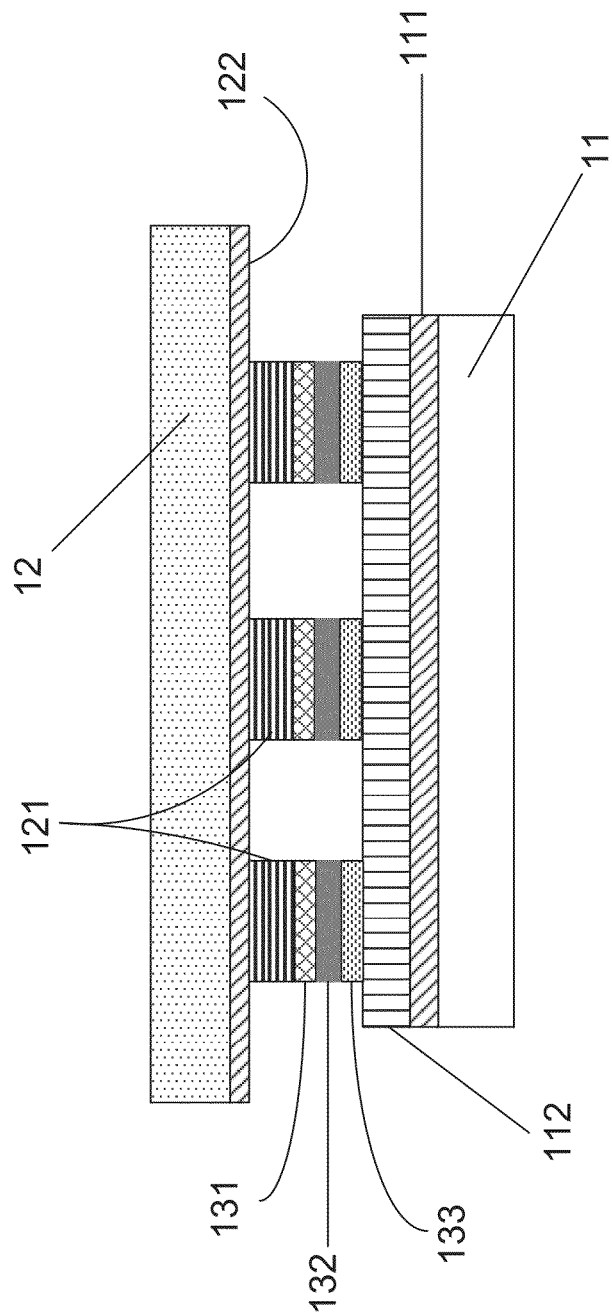
FIG. 4 is a schematic framework view of a Ni/In/Sn/Cu multilayer structure.

Next, step (206) of the method is proceeded for applying a load the first substrate 12 or the second substrate 12, and then executing a reflow bonding process to the first substrate 11 and the second substrate 12 under a specific reflow temperature for a specific reflow time. Eventually, in step (207), it bakes the product of step (6), and then processes an aging heat treatment to the product under a specific heat-treatment temperature for a specific heat-treatment time, so as to form a Ni/In/Sn/Cu multilayer structure including a plurality of intermetallic layers 13. As shown in FIG. 3B, the intermetallic layers 13 includes a first intermetallic layer 131, a second intermetallic layer 132 and a third intermetallic layer 133. Please refer to FIG. 4, there is shown a schematic framework view of a Ni/In/Sn/Cu multilayer structure. As shown in FIG. 4, the Ni/In/Sn/Cu multilayer structure manufacture through above-mentioned 7 steps consists of the second substrate 12, the copper posts 121, a first intermetallic layer 131, the second intermetallic layer 132, the third intermetallic layer 133, and a first substrate 11.

Moreover, it needs to note that, the step (201) in aforesaid Ni/In/Sn/Cu multilayer structure manufacturing method is carried out by following detailed steps: firstly, it uses a copper sheet with 1 $cm^2$ area and 1 mm thickness as the first substrate 11, and then sequentially electroplates the first nickel layer of 2 μm thickness and the indium layer of 6 μm thickness on the first substrate 11 by passing through a 5 ASD (A/$dm^2$) current. Besides, in the aforesaid step (202), the thickness of the second nickel layer 122 is 20 nm, and the specific pattern of the photoresist layer 123 formed on the second substrate 12 is a square with 1 mm×1 mm area. Furthermore, in the aforesaid step (203), the copper layer and the tin layer in the aforesaid step (3) are sequentially electroplated the on the second substrate 12 and the photoresist layer by passing through 5 ASD (A/$dm^2$) current, and the thickness of the copper layer and the tin layer is 25 μm and 5 μm, respectively.

In addition, as shown in FIG. 2B and FIG. 3B, the first substrate 11 is stacked on the second substrate 12 through a flux in the aforesaid step (205), therefore the indium layer 112 on the surface of the first substrate 11 can tightly contact with the copper posts 121 on the second substrate 12. Moreover, there are two reflow boding process conditions for step (206): (1) the specific reflow temperature of the reflow boding process is 200° C. and the specific reflow time is 10 minutes; and (2) the specific reflow temperature of the reflow boding process is 180° C. and the specific reflow time is 10 minutes. Thus, whatever which one conditions is adopted to finish the reflow boding process, the Ni/In/Sn/Cu multilayer structure shown in FIG. 4 can be further obtained after the aging heat treatment is processed under the specific heat-treatment temperature of 100° C. for the specific heat-treatment time of 20 hours-70 hours; wherein the first intermetallic layer 131, the second intermetallic layer 132 and the third intermetallic layer 133 in the Ni/In/Sn/Cu multilayer structure are $(Cu,Ni)_6(Sn,In)_5$, $(Cu,Ni)_6(Sn,In)_5$ and $(Cu,Ni)_3(Sn,In)_4$, respectively.

Figure 5:
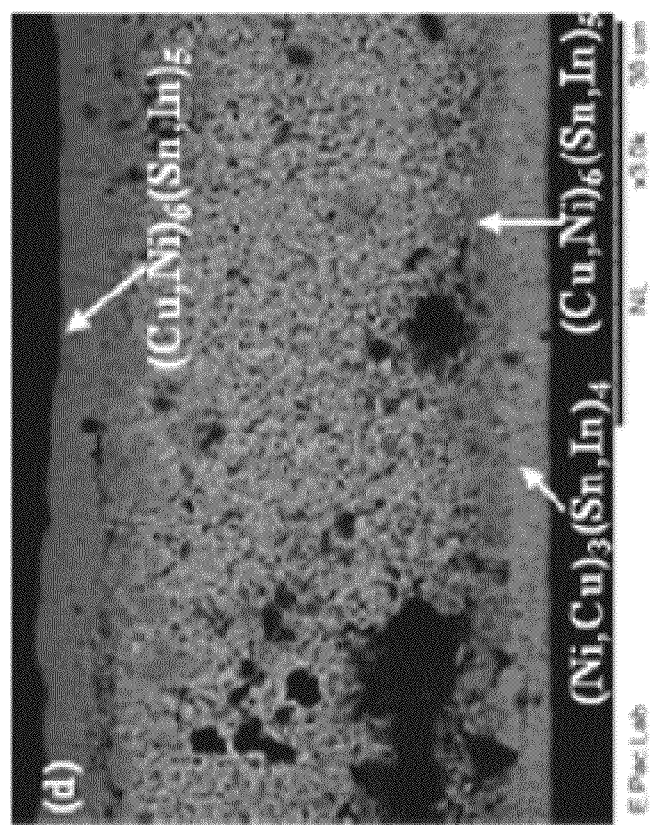
FIG. 5 is a backscattered electron image (BEI) of the Ni/In/Sn/Cu multilayer structure.

Thus, through the descriptions, method for manufacturing Ni/In/Sn/Cu multilayer structure of the present invention has been completely introduced and disclosed; and next, experiment data are presented for proving the practicability and performance of this method. Please refer to FIG. 5, there is shown a backscattered electron image (BEI) of the Ni/In/Sn/Cu multilayer structure. The Ni/In/Sn/Cu multilayer structure shown in FIG. 5 is manufacturing by the present invention's method with reflow temperature of 200° C. Moreover, please compare FIG. 5 with FIG. 4, it can easily find that the intermetallic layers of $(Cu,Ni)_6(Sn,In)_5$ is produced at the interface between the copper posts 121 and the first substrate 12. Furthermore, after continuously processing the aging heat treatment of the step (207), the first intermetallic layer 131 of $(Cu,Ni)_6(Sn,In)_5$ is formed at the interface of the copper posts 121 and the second intermetallic layer 132 of $(Cu,Ni)_6(Sn,In)_5$ is formed at the interface of the first substrate 11; in addition, the third intermetallic layer 133 of $(Cu,Ni)_3(Sn,In)_4$ is also formed at the interface of the first substrate 11, and located between the interface of the first substrate 11 and the second intermetallic layer 132.

Figure 6A:
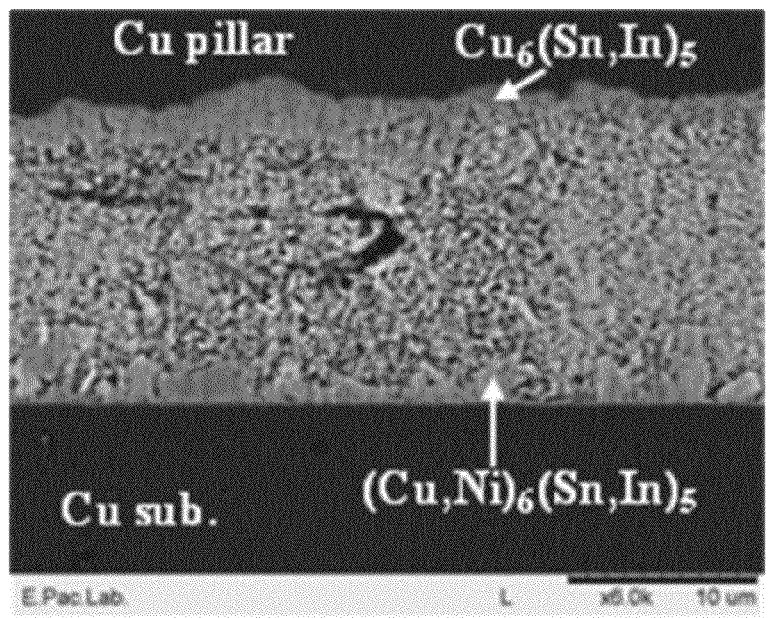
FIGS. 6A and 6B are backscattered electron images of the Ni/In/Sn/Cu multilayer structure.

Please continuously refer to FIG. 6A, which illustrates the backscattered electron image of the Ni/In/Sn/Cu multilayer structure. The Ni/In/Sn/Cu multilayer structure shown in FIG. 6A is manufacturing by the present invention's method with reflow temperature of 180° C. Through FIG. 6, it can find that an intermediate product is produced at the interface of the copper posts 121 after the reflow boding process is finished.

Figure 6B:
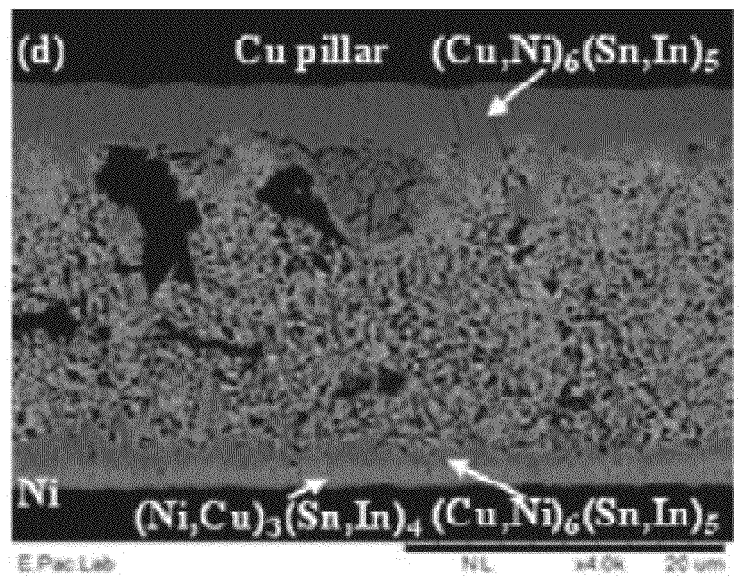

Please refer to FIG. 6B, which illustrates the backscattered electron image of the Ni/In/Sn/Cu multilayer structure. The Ni/In/Sn/Cu multilayer structure shown in FIG. 6B is manufacturing by the present invention's method with reflow temperature of 180° C. Furthermore, processing the aging heat treatment of the step (207) to the Ni/In/Sn/Cu multilayer structure of FIG. 6A, the intermediate product is transformed to the intermetallic layers of $(Cu,Ni)_6(Sn,In)_5$ (as shown in FIG. 6B), moreover, the first intermetallic layer 131 of $(Cu,Ni)_6(Sn,In)_5$ is formed at the interface of the copper posts 121, the second intermetallic layer 132 of $(Cu,Ni)_6(Sn,In)_5$ is formed at the interface of the first substrate 11, and the third intermetallic layer 133 of $(Cu,Ni)_3(Sn,In)_4$ is formed at the interface of the first substrate 11 and located between the interface of the first substrate 11 and the second intermetallic layer 132.

Thus, through the method for manufacturing Ni/In/Sn/Cu multilayer structure of the present invention has been completely introduced and disclosed; in summary, the present invention has the following advantages:
1. In the method for manufacturing Ni/In/Sn/Cu multilayer structure, a Ni/In/Sn/Cu multilayer structure is formed between a first substrate and a second substrate, and further, a plurality of intermetallic layers are formed in the Ni/In/Sn/Cu multilayer structure through a reflow bonding process and an aging heat treatment, wherein the intermetallic layers comprises a first intermetallic layer of $(Cu,Ni)_6(Sn,In)_5$, a second intermetallic layer of $(Cu,Ni)_6(Sn,In)_5$ and a third intermetallic layer of $(Cu,Ni)_3(Sn,In)_4$. Therefore, the formed intermetallic layers makes the Ni/In/Sn/Cu multilayer structure performs good wettability, ductility, creep resistance, and fatigue resistance. Moreover, this Ni/In/Sn/Cu multilayer structure can be made by low-temperature bonding process, so that Ni/In/Sn/Cu multilayer structure can be an alternative solder for replacing the traditional high-temperature Pb solder and being applied in the package process of 3D IC.
2. Inheriting to above point 1, this Ni/In/Sn/Cu multilayer structure having the intermetallic layers of $(Cu,Ni)_6(Sn,In)_5$ and $(Cu,Ni)_6(Sn,In)_5$ is suitable for being used to joint two substrates, the reason is that the bonding strength of the two substrates can be enhanced since the $(Cu,Ni)_6(Sn,In)_5$ and $(Cu,Ni)_6(Sn,In)_5$ include high melting point characteristics, moreover, the bridge phenomenon occurred in the joint of the traditional high-temperature Pb solder can also be solved; Accordingly, this Ni/In/Sn/Cu multilayer structure having the intermetallic layers of $(Cu,Ni)_6(Sn,In)_5$ and $(Cu,Ni)_6(Sn,In)_5$ is suitable for being applied in the package process of 3D IC.

The above description is made on embodiments of the present invention. However, the embodiments are not intended to limit scope of the present invention, and all equivalent implementations or alterations within the spirit of the present invention still fall within the scope of the present invention.

What is claimed is:
1. A method for manufacturing Ni/In/Sn/Cu multilayer structure, comprising the steps of:
   (1) sequentially electroplating a first nickel layer and an indium layer on a first substrate;
   (2) forming a second nickel layer on a second substrate by way of sputtering deposition, and then forming a photoresist layer having a specific pattern on the second nickel layer through photolithography;
   (3) sequentially electroplating a copper layer and a tin layer on the second substrate and the photoresist layer;
   (4) removing the photoresist layer for forming a plurality copper posts on the second substrate;
   (5) stacking the first substrate onto the second substrate, so as to make the indium layer on the surface of the first substrate tightly contact with the copper posts on the second substrate;
   (6) applying a load to the first substrate or the second substrate, and then executing a reflow bonding process to the first substrate and the second substrate under a specific reflow temperature for a specific reflow time; and
   (7) baking the product of step (6), and then processing an aging heat treatment to the product under a specific heat-treatment temperature for a specific heat-treatment time, so as to form a multilayer structure having a plurality of intermetallic layers.

2. The method for manufacturing Ni/In/Sn/Cu multilayer structure of claim 1, wherein the step (1) further comprises the detailed steps of:
   (11) using a copper sheet with 1 cm$^2$ area and 1 mm thickness as the first substrate;
   (12) sequentially electroplating the first nickel layer of 2 μm thickness and the indium layer of 6 μm thickness on the first substrate by 5 ASD (A/dm$^2$) current.

3. The method for manufacturing Ni/In/Sn/Cu multilayer structure of claim 1, wherein the thickness of the second nickel layer in aforesaid step (2) is 20 nm.

4. The method for manufacturing Ni/In/Sn/Cu multilayer structure of claim 1, wherein the specific pattern of the photoresist layer formed on the second substrate is a square with 1 mm×1 mm area.

5. The method for manufacturing Ni/In/Sn/Cu multilayer structure of claim 1, wherein the copper layer and the tin layer in the aforesaid step (3) are sequentially electroplated on the second substrate and the photoresist layer by 5 ASD (A/dm$^2$) current, and the thickness of the copper layer and the tin layer is 25 μm and 5 μm, respectively.

6. The method for manufacturing Ni/In/Sn/Cu multilayer structure of claim 1, wherein the first substrate is stacked on the second substrate through a flux in the step (5).

7. The method for manufacturing Ni/In/Sn/Cu multilayer structure of claim 1, wherein the specific reflow temperature in the step (6) is 200° C., and the specific reflow time is 10 minutes.

8. The method for manufacturing Ni/In/Sn/Cu multilayer structure of claim 1, wherein the specific reflow temperature in the step (6) is 180° C., and the specific reflow time is 10 minutes.

9. The method for manufacturing Ni/In/Sn/Cu multilayer structure of claim 1, wherein the specific heat-treatment temperature in the step (7) is 100° C., and the specific heat-treatment time is ranged from 20 hours to 70 hours.

10. The method for manufacturing Ni/In/Sn/Cu multilayer structure of claim 1, wherein the intermetallic layers comprises a first intermetallic layer of $(Cu,Ni)_6(Sn,In)_5$, a second intermetallic layer of $(Cu,Ni)_6(Sn,In)_5$ and a third intermetallic layer of $(Cu,Ni)_3(Sn,In)_4$.

* * * * *